United States Patent
Zhou

(10) Patent No.: US 10,923,675 B2
(45) Date of Patent: Feb. 16, 2021

(54) OLED DISPLAY PANEL AND PREPARATION METHOD THEREOF

(71) Applicant: Wuhan China Star Optoelectronics Semiconductor Display Technology Co., Ltd., Wuhan (CN)

(72) Inventor: Sisi Zhou, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/492,160

(22) PCT Filed: Jun. 19, 2019

(86) PCT No.: PCT/CN2019/091805
§ 371 (c)(1),
(2) Date: Sep. 9, 2019

(87) PCT Pub. No.: WO2020/220445
PCT Pub. Date: Nov. 5, 2020

(65) Prior Publication Data
US 2020/0343476 A1    Oct. 29, 2020

(51) Int. Cl.
*H01L 51/56* (2006.01)
*H01L 51/52* (2006.01)

(52) U.S. Cl.
CPC .......... *H01L 51/5237* (2013.01); *H01L 51/56* (2013.01)

(58) Field of Classification Search
None
See application file for complete search history.

(56) References Cited

U.S. PATENT DOCUMENTS

2019/0123115 A1* 4/2019 Sun ..................... H01L 27/3225
2020/0236260 A1* 7/2020 Yang ................... H04M 1/0264

* cited by examiner

*Primary Examiner* — Asok K Sarkar

(57) ABSTRACT

An organic light emitting diode (OLED) display panel includes a display area, and the display area includes: a light transmissive zone; a display zone surrounding the light transmissive zone; and a common layer disposed on the display zone; the common layer includes an organic electroluminescence device and a thin film encapsulation layer, and there is no common layer disposed on the light transmissive zone.

12 Claims, 6 Drawing Sheets

OLED DISPLAY PANEL AND PREPARATION METHOD THEREOF

RELATED APPLICATIONS

This application is a National Phase of PCT Patent Application No. PCT/CN2019/091805 having International filing date of Jun. 19, 2019, which claims the benefit of priority of Chinese Patent Application No. 201910347807.5 filed on Apr. 28, 2019. The contents of the above applications are all incorporated by reference as if fully set forth herein in their entirety.

FIELD AND BACKGROUND OF THE INVENTION

The present disclosure relates to a display technology field, and particularly relates to an organic light emitting diode (OLED) display panel and preparation method thereof.

In order to increase the screen-to-body ratio of electronic products, non-display area on display panels is compressed smaller and smaller. In order to compress the non-display area on display panels of mobile phones as much as possible, one technique is that a hole (a notch shaped area) is provided at the upper display area and devices such as a front camera and an earpiece of a mobile phone are placed in the hole has appeared.

A common display panel on the market is illustrated in FIG. 1. As illustrated in FIG. 1, the display panel sequentially includes an outer frame 1 of a panel and a display area 2 from outside to inside, and are encapsulated by pressure welding technology. For compressing the non-display area, the outer frame of the display panel is a shape of the panel, and the inner frame is the display area. A hole is disposed on the upper display area 2 for disposing devices such as a front camera and an earpiece.

Organic light emitting diode (OLED) display technology has self-illumination characteristics, and is applied a very thin coating of organic material and a glass substrate. When there is current passing through, the organic material will emit light, and the OLED display panel has a wide viewing angle and can save electric energy.

However, one technical problem is that disposing the hole in the display area affects regularity and integrity of the display area, and cannot realize a full-screen display of the electronic device. Meanwhile, since a cathode transmittance of an OLED display panel is only 40%, and a transmittance of the thin film encapsulation layer is less than 90%, the light transmissive zone needs to steer clear of the organic electroluminescent device and the thin film encapsulation layer. If the light transmissive zone needs to be cut off, the thin film encapsulation layer of the OLED display panel also needs to be steered clear of at the cutting point. Currently, a common mask evaporation is applied on both of the cathode and the thin film encapsulation layer to form a hole on a display area mask, and how to steer clear of the light transmissive zone when forming a membrane layer by an evaporation process is the problem that requires to be solved.

Therefore, it is necessary to provide a new display panel that a light transmissive zone is disposed within an area where a front camera corresponds to the display area to overcome the defects mentioned above. In addition, it is also necessary to provide a preparation method for producing the display panel to overcome the defects mentioned above.

SUMMARY OF THE INVENTION

The purpose of the present disclosure is to provide an organic light emitting diode (OLED) display panel that ensures the regularity and integrity of the display area and realizes the full-screen display of the electronic device without increasing the screen-to-body ratio.

Another purpose of the present disclosure is to provide a preparation method for producing the display panel mentioned above to solve the problem that it is difficult to steer clear of the light transmissive zone when evaporating the organic electroluminescent device and the thin film encapsulation layer in the prior art.

In order to achieve the purpose mentioned above, the present disclosure provides a display panel which includes a display area, and the display area includes:

a light transmissive zone;

a display zone surrounding the light transmissive zone; and a common layer disposed on the display zone; wherein the common layer includes an organic electroluminescence device and a thin film encapsulation layer, and there is no common layer disposed on the light transmissive zone.

Based on the above, the light transmissive zone is disposed on any location of the display area.

Based on the above, a shape of the display area is a circular shape, a rectangular shape, a polygonal shape, or other irregular shape.

Preferably, a shape of the display area is a shape of a circular wearable display.

Based on the above, the light transmissive zone is a circular shape, a rectangular shape, a polygonal shape, an elliptical shape, or other irregular shape.

It will be understood by those skilled in the art, unless otherwise specified, that the organic electroluminescent device and the thin film encapsulation layer of the common layer are formed from conventional materials in the art by conventional techniques in the art.

The present disclosure further provides a preparation method for producing the display panel, and the preparation method includes:

disposing a shielding element on the light transmissive zone;

disposing a common mask on the display area;

forming a common layer by an evaporation method on the display area;

removing the shielding element and removing an area of the common layer covering on the shielding element.

Further, before disposing the common mask, a fine metal mask (FMM), or a thin film encapsulation layer, disposing the shielding element in the light transmissive zone.

Based on the above, the shielding element is aligned with or overlapped a center of the light transmissive zone.

Based on the above, a side of a shape of the shielding element is longer than a side of a shape of the light transmissive zone ranging from 50 um to 300 um.

Based on the above, the shielding element is a shielding mask formed by any known material.

Further, after a thin film is encapsulated, the shielding element is removed, and a membrane layer deposited on the shielding element is removed.

It will be understood by those skilled in the art, unless otherwise specified, that the common mask and the shielding mask described in the present disclosure are formed from conventional materials in the art by conventional techniques in the art.

In the present disclosure, through disposing the shielding element before an evaporation process for the organic electroluminescence device and the thin film encapsulation layer to steer clear of the light transmissive zone. Further, since the shielding element is disposed before the evaporation process, the light transmissive zone can be disposed on any location of the display area, and the shape is not limited. It has been experimentally shown that the transmittance of the light transmissive zone described in the present disclosure is great.

The beneficial effect of the present disclosure is not only to solve the problem that it is difficult to steer clear of the light transmissive zone when evaporating the organic electroluminescent device and the thin film encapsulation layer in the prior art, but also ensures the regularity and integrity of the display area and realizes the full-screen display of the electronic device without increasing the screen-to-body ratio, thereby making the display panel of the present disclosure have a great display effect.

DETAILED DESCRIPTION OF PREFERRED SPECIFIC EMBODIMENTS OF THE INVENTION

Hereinafter, the technology of the present disclosure will be described in detail with reference to specific embodiments. It should be noted that the following specific embodiments are only used to assist those skilled in the art to understand the present application and is not intended to limit the present disclosure.

The descriptions of embodiments below refer to accompanying figures in order to illustrate certain embodiments which the present disclosure can implement. The directional terms of which the present disclosure mentions, for example, "top," "bottom," "upper," "lower," "front," "rear," "left," "right," "inside," "outside," "side," etc., are just refer to directions of the accompanying figures. Therefore, the used directional terms are for illustrating and understanding the present disclosure, but not for limiting the present disclosure.

The First Embodiment

Figure 1:
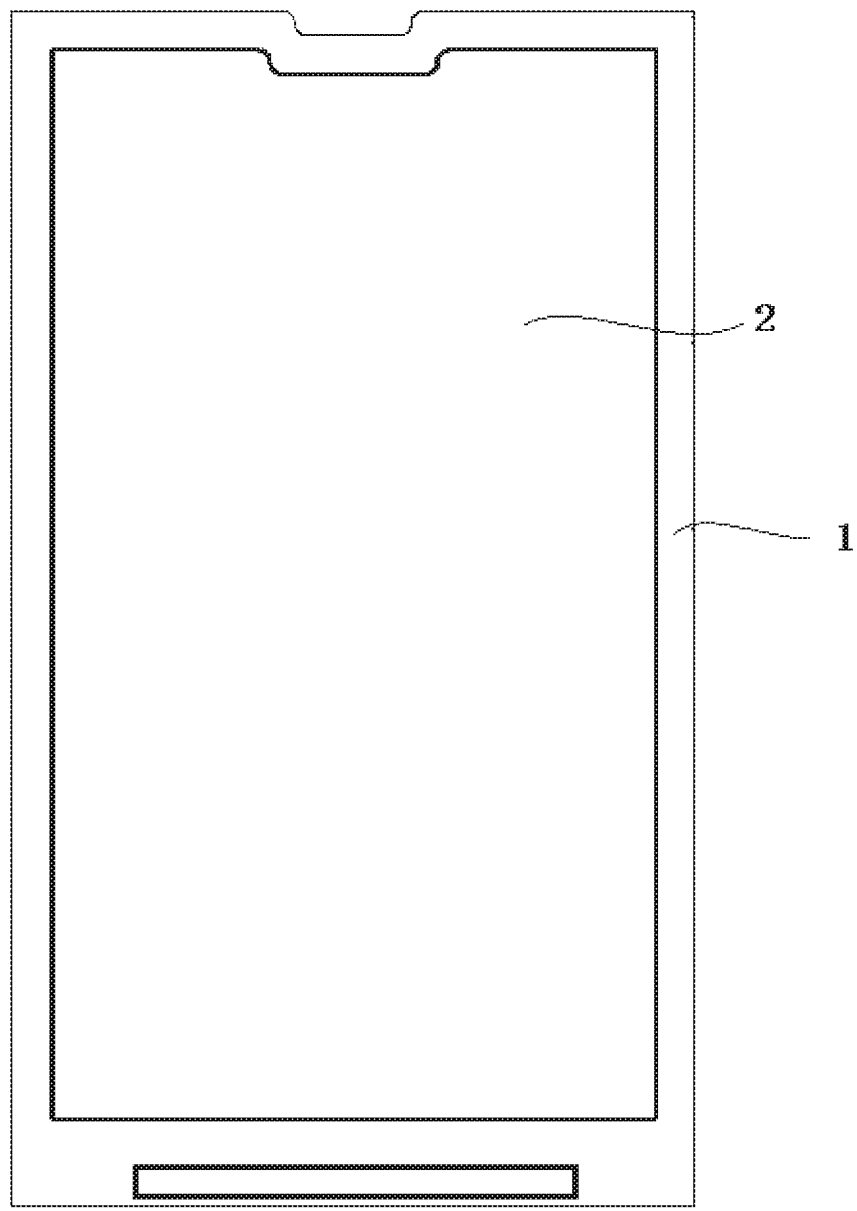
FIG. 1 is a structural schematic diagram of an existing display panel.
Figure 2:
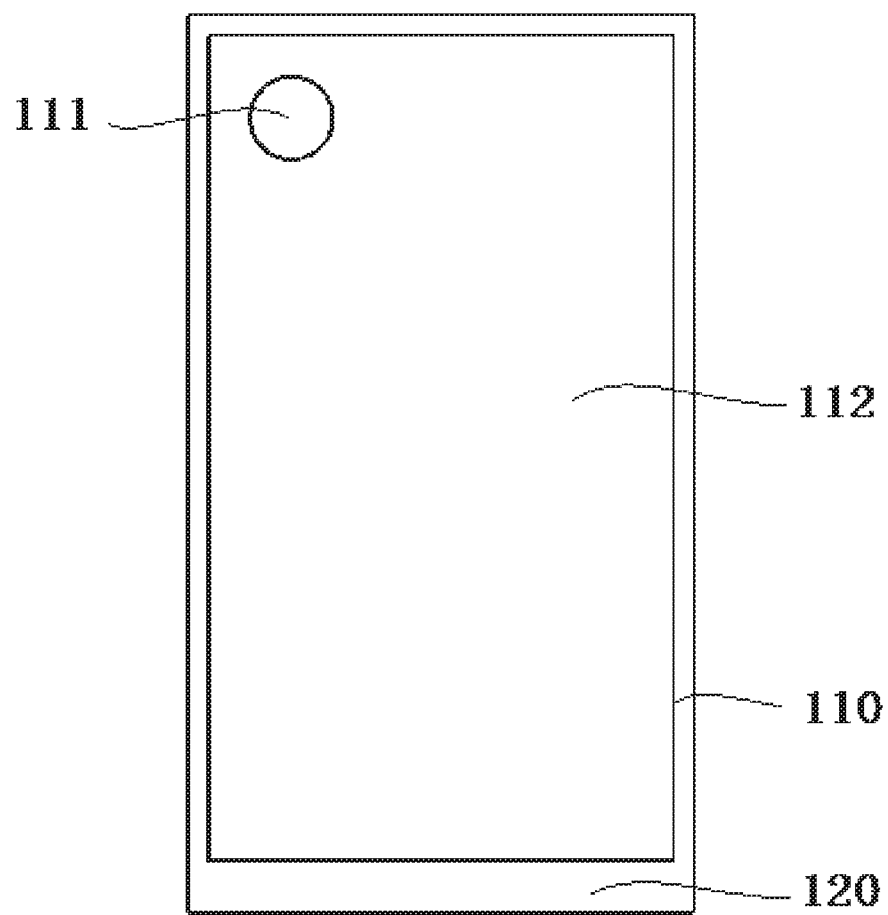
FIG. 2 is a front view structural schematic diagram of the display panel of the first embodiment of the present disclosure.
Figure 3:
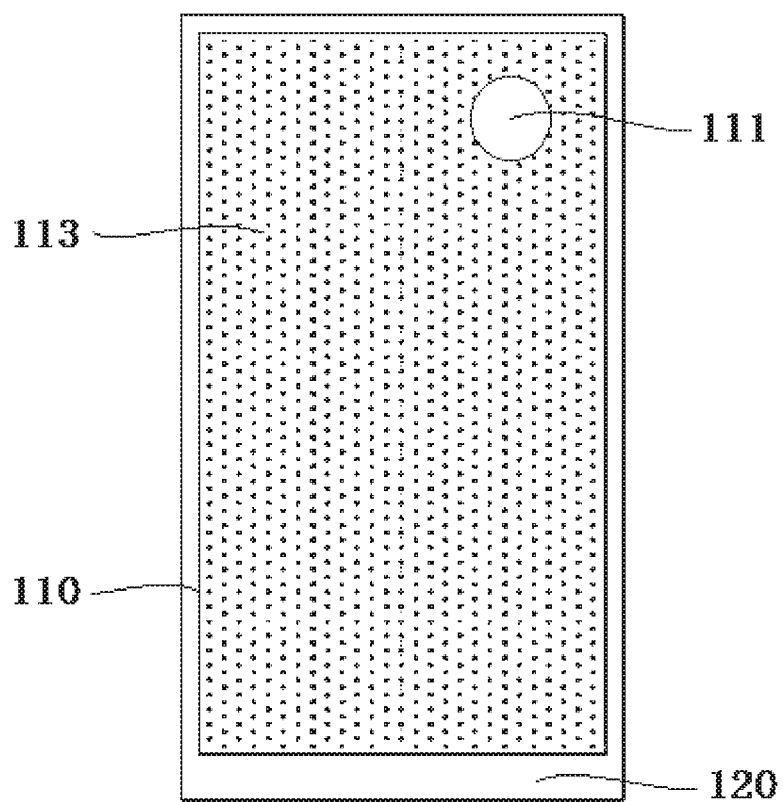
FIG. 3 is a rear view structural schematic diagram of the display panel of the first embodiment of the present disclosure.
Figure 4:
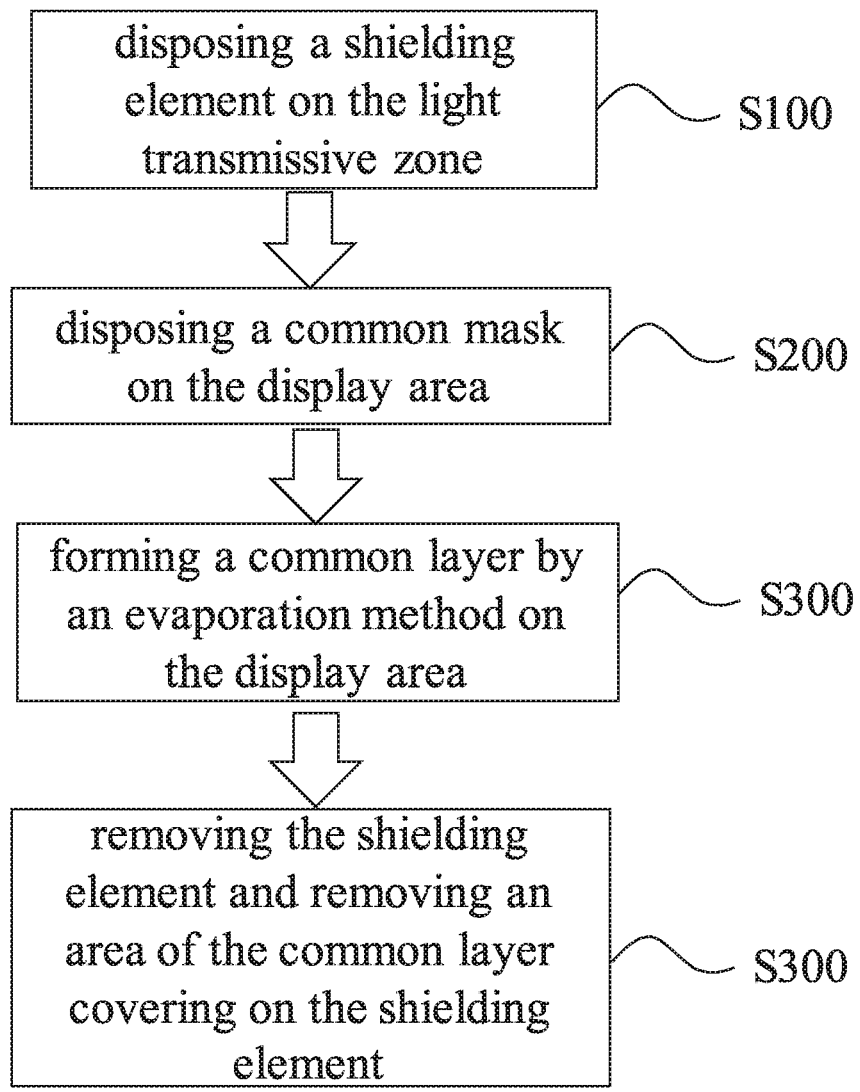
FIG. 4 is a flowchart of the preparation method for the display panel of the first embodiment of the present disclosure.
Figure 5:
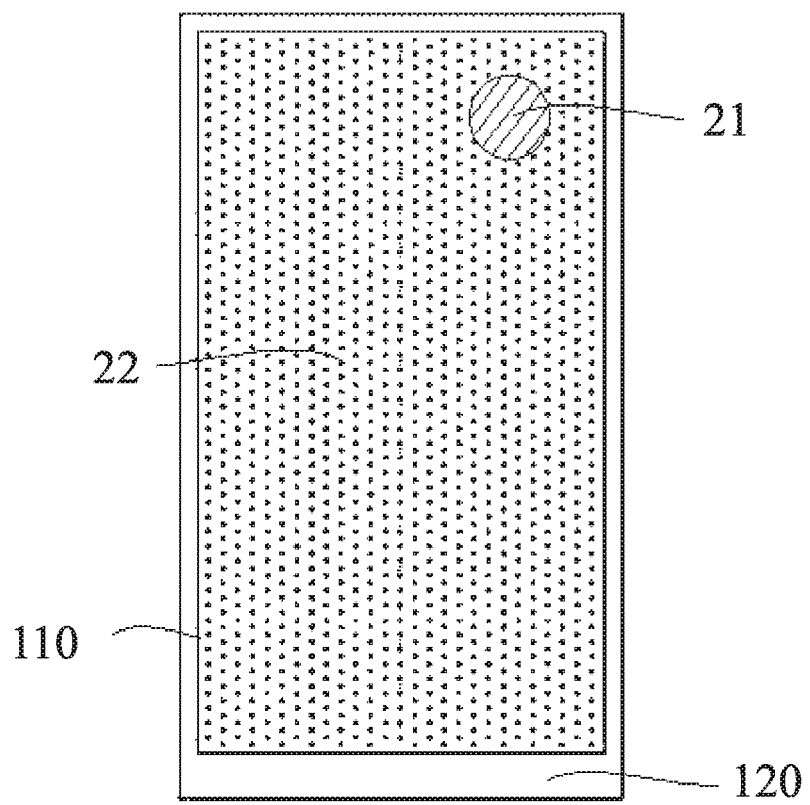
FIG. 5 is a structural flowchart of the preparation method for the display panel corresponding to FIG. 4.

As the front view structural schematic diagram of the display panel of FIG. 2 and the rear view structural schematic diagram of the display panel of FIG. 3, a mobile phone organic light emitting diode (OLED) display panel is provided.

In this embodiment, as illustrated in FIG. 2 and FIG. 3, a light transmissive zone 111 is disposed on a display area 110 of the display panel 100. The display panel 100 includes a display area 110 and an outer frame 120. The display area 110 includes a light transmissive zone 111, a display zone 112 surrounding the light transmissive zone; and a common layer 113 disposed on the display zone 112. The common layer 113 includes an organic electroluminescence device and a thin film encapsulation layer, and there is no common layer 113 disposed on the light transmissive zone 111.

In this embodiment, the light transmissive zone 111 is disposed on an upper left area of the display area 110 to fit the usage habit that the habitual hand of most users is their right hand.

In this embodiment, the display area 110 is in the shape of a conventional mobile phone display panel, and can also be a circular shape, a rectangular shape, a polygonal shape, or an irregular shape.

Therefore, in this embodiment, because there is no common layer which includes an organic electroluminescence device and a thin film encapsulation layer disposed on the light transmissive zone 111, the transmittance of the light transmissive zone is improved. If the light transmissive zone is cut off, the common layer that included the organic electroluminescent device and the thin film encapsulation layer on the cutting line can be avoided to avoid water vapor irrupting. Therefore, without increasing the screen-to-body ratio, ensures the regularity and integrity of the display area 110 and realizes the full-screen display of the electronic device, thereby making the display panel 100 of the present disclosure have great display effect.

It will be understood by those skilled in the art, that the organic electroluminescent device and the thin film encapsulation layer of the common layer 113 are formed from conventional materials in the art by conventional techniques in the art.

In this embodiment, provides a preparation method for producing the display panel 100 mentioned above.

As illustrated in FIG. 2 to FIG. 5, the preparation method includes:

S100: disposing a shielding element 21 on the light transmissive zone 111.

S200: disposing a common mask 22 on the display area 110.

S300: forming a common layer 113 by an evaporation method on the display area 110.

S400: removing the shielding element 21 and removing an area of the common layer 113 covering on the shielding element.

In this embodiment, in the step S100, before disposing the common mask, a fine metal mask (FMM), or a thin film encapsulation layer, disposing the shielding element in the light transmissive zone.

The shielding element 21 is aligned with a center of the light transmissive zone 111.

In this embodiment, a side of a shape of the shielding element 21 is longer than a side of a shape of the light transmissive zone 111 about 300 um.

In this embodiment, the shielding element 21 is a shielding mask.

It will be understood by those skilled in the art, the common mask 22 and the shielding mask described in the present disclosure are formed from conventional materials in the art by conventional techniques in the art.

Of course, the preparation method further includes known processes such as pressure welding, and will not give unnecessary details.

The Second Embodiment

Figure 6:
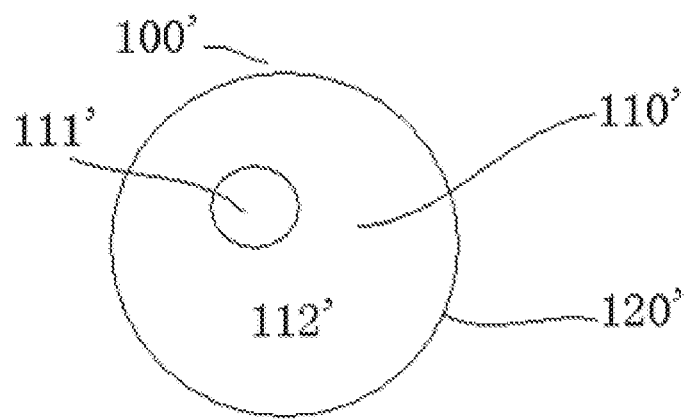
FIG. 6 is a front view structural schematic diagram of the display panel of the second embodiment.

As illustrated in FIG. 6, provides a circular wearable OLED display panel 100', the display panel 100' includes a display area 110' and an outer frame 120'. A circular light transmissive zone 111' is disposed on the display area 110' of the display panel 100'.

The display area 110' includes: a light transmissive zone 111', a display zone 112' surrounding the light transmissive zone 111'; and a common layer (not shown in the figure) disposed on the display zone 112'; the common layer includes an organic electroluminescence device and a thin film encapsulation layer, and there is no common layer disposed on the light transmissive zone 111'.

In this embodiment, the light transmissive zone 111' is disposed on upper left area or a center location of the display area 110'.

In this embodiment, provides a preparation method for producing the display panel 100' mentioned above.

The preparation method is similar to that of the first embodiment, and includes:

S100: disposing a shielding element on the light transmissive zone 111'.

S200: disposing a common mask on the display area 110'.

S300: forming a common layer by an evaporation method on the display area 110'.

S400: removing the shielding element and removing an area of the common layer covering on the shielding element.

In this embodiment, in the step S100, before disposing the common mask, a fine metal mask (FMM), or a thin film encapsulation layer, disposing the shielding element in the light transmissive zone.

The shielding element is aligned with a center of the light transmissive zone 111'.

In this embodiment, a side of a shape of the shielding element is longer than a side of a shape of the light transmissive zone 111' 50 um.

In this embodiment, the shielding element is a shielding mask formed by any known material.

It will be understood by those skilled in the art, the common mask and the shielding mask described in the present disclosure are formed from conventional materials in the art by conventional techniques in the art.

The Third Embodiment

Figure 7:
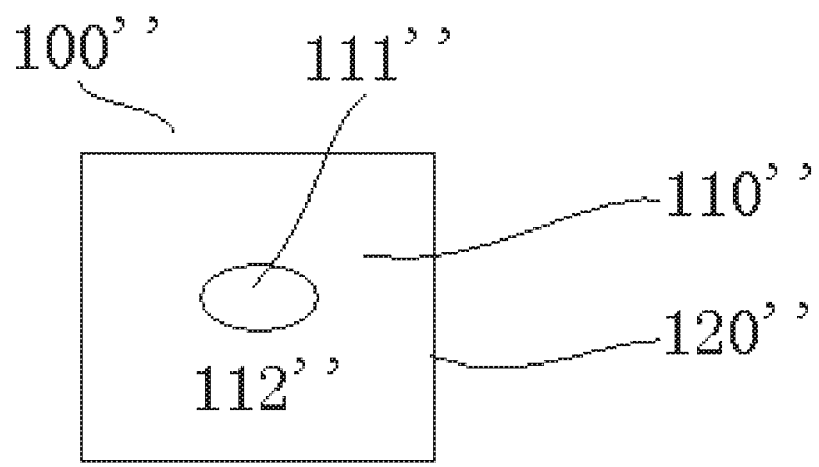
FIG. 7 is a front view structural schematic diagram of the display panel of the third embodiment.

As illustrated in FIG. 7, provides a rectangular OLED display panel 100", the display panel 100" includes a display area 110" and an outer frame 120". A light transmissive zone 111" is disposed on the display area 110" of the display panel 100".

In this embodiment, the display area 110" is a rectangular shape and includes: an elliptical transmissive zone 111", a display zone 112" surrounding the light transmissive zone 111"; and a common layer (not shown in the figure) disposed on the display zone 112"; the common layer includes an organic electroluminescence device and a thin film encapsulation layer, and there is no common layer disposed on the light transmissive zone 111".

In this embodiment, the light transmissive zone 111" is disposed on a center location of the display area 110".

In this embodiment, a preparation method for producing the display panel 100" mentioned above is provided.

The preparation method is similar to that of the first embodiment, and includes:

S100: disposing a shielding element on the light transmissive zone 111".

S200: disposing a common mask on the display area 110".

S300: forming a common layer by an evaporation method on the display area 110".

S400: removing the shielding element and removing an area of the common layer covering on the shielding element.

In this embodiment, in the step S100, before disposing the common mask, a fine metal mask (FMM), or a thin film encapsulation layer, disposing the shielding element in the light transmissive zone.

The shielding element is aligned with a center of the light transmissive zone 111".

In this embodiment, a side of a shape of the shielding element is longer than a side of a shape of the light transmissive zone 111" 80 um.

In this embodiment, the shielding element is a shielding mask formed by any known material.

It will be understood by those skilled in the art, the common mask and the shielding mask described in the present disclosure are formed from conventional materials in the art by conventional techniques in the art.

The present disclosure has been described in detail by the embodiments mentioned above, but the embodiments mentioned above are merely examples for implementing the present disclosure. It should be noted that the disclosed embodiments are not intended to limit the scope of the present disclosure. Rather, modifications and equivalent arrangements included in the spirit and scope of the claims are included in the scope of the present disclosure.

The subject matter of the present disclosure can be manufactured and applied in the industry and has industrial applicability.

What is claimed is:

1. An organic light emitting diode (OLED) display panel, comprising a display area, wherein the display area comprises:
   a light transmissive zone;
   a display zone surrounding the light transmissive zone; and
   a common layer disposed on the display zone;
   wherein the common layer comprises an organic electroluminescence device and a thin film encapsulation layer, no common layer is disposed on the light transmissive zone, and there is no cutting line on the common layer.

2. The OLED display panel as claimed in claim 1, wherein the light transmissive zone is disposed on the display area.

3. The OLED display panel as claimed in claim 1 wherein a shape of the display area is one of a circular shape, a rectangular shape, a polygonal shape, or an irregular shape.

4. The OLED display panel as claimed in claim 3, wherein a shape of the light transmissive area is one of a circular shape, a rectangular shape, a polygonal shape, or an elliptical shape.

5. A preparation method for an organic light emitting diode (OLED) display panel, wherein the OLED display panel comprises a display area which comprises a light transmissive zone and a display zone surrounding the light transmissive zone, and the preparation method comprises:
   defining the light transmissive zone and the display zone surrounding the light transmissive zone of the display area on a substrate on the OLED display panel;
   disposing a shielding element on the light transmissive zone;
   disposing a common mask on the display area;
   forming a common layer by an evaporation method on the display area; and
   removing the shielding element and removing an area of the common layer covering on the shielding element, making the common layer formed in the display zone not in the light transmissive zone;

wherein the common layer comprises an organic electroluminescence device and a thin film encapsulation layer no common layer is disposed on the light transmissive zone, and there is no cutting line on the common layer.

6. The preparation method as claimed in claim 5, wherein the light transmissive zone is disposed on the display area.

7. The preparation method as claimed in claim 5, wherein a shape of the shielding element is one of a circular shape, a rectangular shape, a polygonal shape, or an elliptical shape.

8. The preparation method as claimed in claim 5, wherein before disposing the common mask, a fine metal mask (FMM) or a thin film encapsulation layer, disposing the shielding element in the light transmissive zone.

9. The preparation method as claimed in claim 5, wherein the shielding element is aligned with a center of the light transmissive zone.

10. The preparation method as claimed in claim 5, wherein a side of a shape of the shielding element is longer than a side of a shape of the light transmissive zone ranging from 50 um to 300 um.

11. The preparation method as claimed in claim 5, wherein the shielding element is a shielding mask.

12. The preparation method as claimed in claim 5, wherein after a thin film is encapsulated, the shielding element is removed, and a membrane layer deposited on the shielding element is removed.

* * * * *

UNITED STATES PATENT AND TRADEMARK OFFICE
CERTIFICATE OF CORRECTION

PATENT NO.         : 10,923,675 B2
APPLICATION NO.    : 16/492160
DATED              : February 16, 2021
INVENTOR(S)        : Sisi Zhou Page 1 of 1

It is certified that error appears in the above-identified patent and that said Letters Patent is hereby corrected as shown below:

On the Title Page

Insert the following:
--(30) Foreign Application Priority Data
Apr. 28, 2019 (CN).............................. 201910347807.5--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*